(12) United States Patent
Kato et al.

(10) Patent No.: US 6,447,314 B1
(45) Date of Patent: Sep. 10, 2002

(54) HINGE CONNECTOR EXTENSIBLE TO A LONGITUDINAL DIRECTION

(75) Inventors: Nobukazu Kato, Fussa; Kazukuni Hisatomi, Higashiyamato; Kazuhito Hisamatsu, Hino; Kazuhiro Fujino, Chofu, all of (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 09/456,650

(22) Filed: Dec. 8, 1999

(30) Foreign Application Priority Data

Dec. 10, 1998 (JP) ............................... 10-351766
Sep. 29, 1999 (JP) ............................... 11-276154

(51) Int. Cl.[7] .......................... H01R 3/00; H01R 39/00; H05K 5/00
(52) U.S. Cl. .......................... 439/165; 439/31; 361/755
(58) Field of Search .................... 439/165, 31, 15; 361/755, 680; 174/89

(56) References Cited

U.S. PATENT DOCUMENTS

| | | | |
|---|---|---|---|
| 4,986,763 A | 1/1991 | Boyle | 439/165 |
| 5,681,176 A | 10/1997 | Ibaraki et al. | 439/165 |
| 5,978,210 A | * 11/1999 | McCrary | 361/680 |

FOREIGN PATENT DOCUMENTS

| | | | |
|---|---|---|---|
| EP | 0 581 180 A3 | 2/1994 | H01R/13/40 |
| EP | 0 581 180 A2 | 2/1994 | H01R/13/40 |
| GB | 2 212 971 A | 8/1989 | H02G/11/00 |

* cited by examiner

Primary Examiner—Brian Sircus
Assistant Examiner—Chandrika Prasad
(74) Attorney, Agent, or Firm—Michael Best & Friedrich LLC; Laff, Whitesel & Saret, Ltd.; J. Warren Whitesel

(57) ABSTRACT

In order to prevent damage to an electroconductive member during an assembly process or when using electronic equipment, a hinge connector is constituted primarily by a main unit connector assembly to be connected to a connector of a computer main unit, an LCD connector assembly to which an FPC from an LCD is connected, and an electroconductive member to be installed in these connector assemblies. The electroconductive member is comprised of connections provided at both ends and a flexible portion located between the connections. The flexible portion has a plurality of slits that extend in a direction for connecting the connections so that the flexible portion is contractible in the foregoing direction.

13 Claims, 21 Drawing Sheets

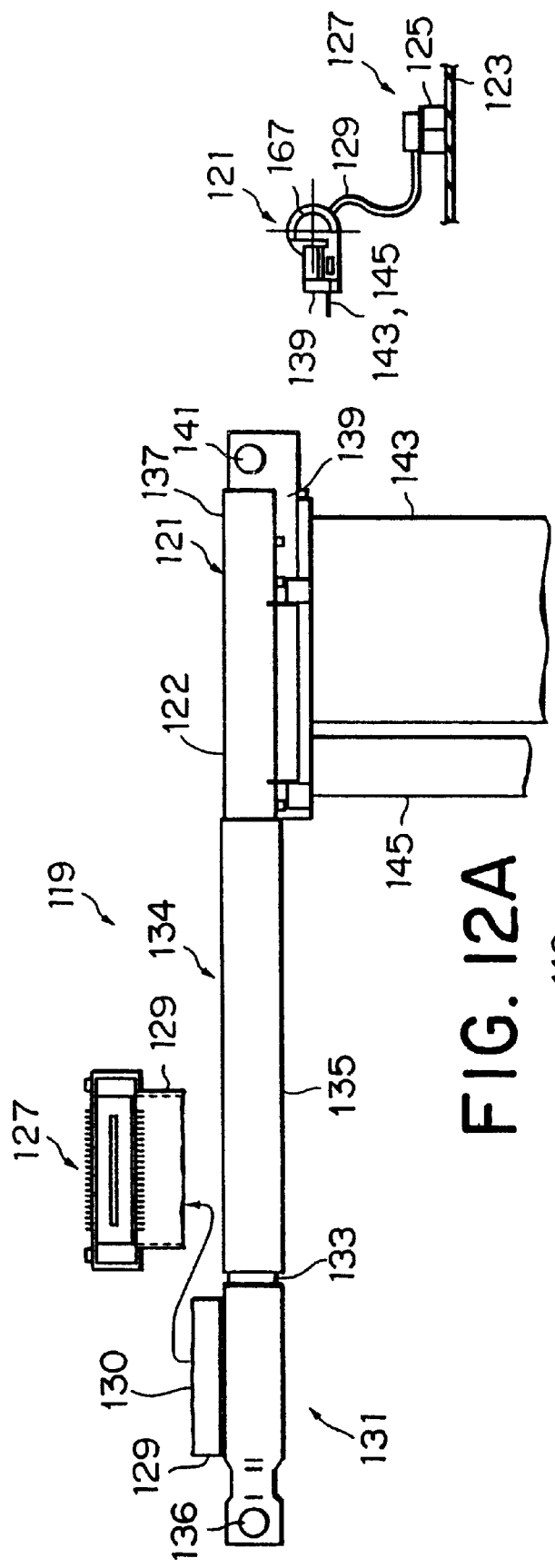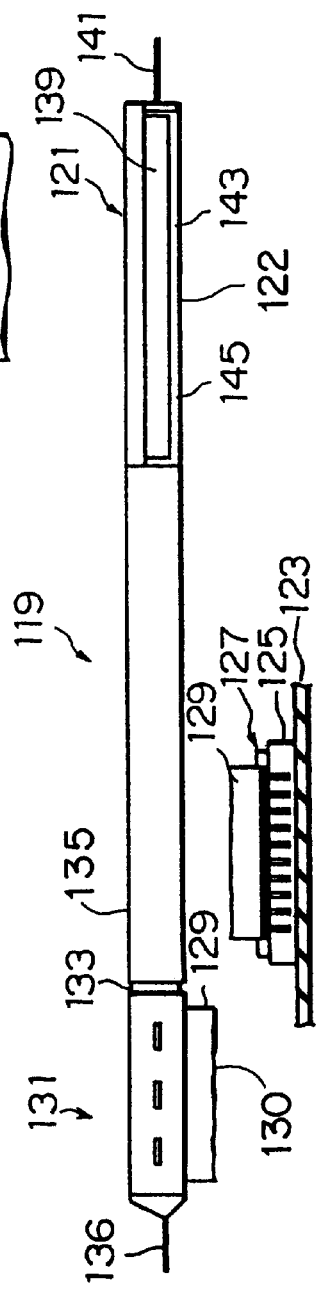

HINGE CONNECTOR EXTENSIBLE TO A LONGITUDINAL DIRECTION

BACKGROUND OF THE INVENTION

1. Field of the Invention

The present invention relates to a hinge connector used for electrically connecting two portions that rotatably move relative to each other in electronic equipment, such as, a portable telephone and/or a personal computer.

2. Description of the Related Art

Hitherto, in order to electrically connect circuit boards that are respectively housed in two portions of electronic equipment, required connectors are attached to the respective portions. An FPC, FFC or other type of electroconductive member is used to make connection between the connectors.

In some types of portable telephones or notebook type computers, a structure is employed in which a display section, such as an LCD display, and a main body of equipment are rotatable connected to each other. A hinge connector has been used to make electrical connection between such rotatably installed two portions.

The hinge connector has a structure in which a flexible electroconductive member in the form of a thin sheet is installed in a first cylindrical component and a second cylindrical component that is rotatable installed to the first cylindrical component. In the structure, a connection at one end of the electroconductive member is connected to a connector of one portion via an opening of the cylindrical component, while a connection at the other end is connected to a connector of the other portion via the opening of the cylindrical component.

The foregoing conventional hinge connectors have been posing problems described below when the connections of the electroconductive member connect to the associated connectors of the portions via the connections of the cylindrical components.

Although the electroconductive member is formed in a thin sheet which is flexible in a direction of its thickness, it is difficult to bend the member in a direction orthogonal to the thickness, i.e., in a direction of its width. On the other hand, when the connections of the electroconductive member are connected or fitted to the connectors of the portions, the electroconductive member is bent to a certain degree in the direction of its width in addition to the direction of its thickness; hence, forcible connection or fitting leads to damage, such as cut or breakage of the electroconductive member in some cases. The damage sometimes occurs when one portion is rotated with respect to the other portion in using electronic equipment.

Furthermore, if the electroconductive member is given one turn and installed, then the turned portion bulges. Taking the bulge into account in a design stage has inevitably increased a hinge diameter, or the turn has caused the turned portion to shrink or expand. Consequently, rubbing has taken place in the electroconductive member, leading to a shortened service life of the hinge.

In addition, a repulsive force of the electroconductive member generated by bending it widthwise is relatively large to cause a crack in the connector of a mating portion or a disconnection of or damage to a soldered portion between the connector and a circuit board thereof in some cases. Especially in recent years, hinge connectors are increasingly becoming smaller and thinner due to a further reducing thickness of electronic equipment, such as portable telephones and personal computers, so that the problems described above are becoming more obstructive.

SUMMARY OF THE INVENTION

Accordingly, it is a first technological object of the present invention to provide a hinge connector capable of preventing the foregoing damage from occurring in an FPC or other electroconductive members.

It is a second technological object of the present invention to provide a hinge connector capable of connecting a plurality of FPCs or the like.

To these ends, according to one aspect of the present invention, there is provided a hinge connector for electrically connecting a first portion and a second portion that is rotatably combined to the first portion. The hinge connector comprises a first connector assembly, a second connector assembly that is rotatably combined to the first connector, and an electroconductive member coupled to the first connector assembly and the second connector assembly. The electroconductive member has a first connection which is provided at one end thereof and connected to the first connector assembly and a second connection which is provided at the other end thereof and connected to the second connector assembly, and a flexible portion positioned between the first connection and the second connection. The flexible portion is contractible in a direction for connecting the first connection and the second connection.

According to another aspect of the present invention, there is provided a hinge connector which comprises a coupling member in which an electroconductive member including a first FPC is disposed and which is extensible in rotational and axial directions, and a pair of connector assemblies connected via the coupling member such that they can rotate about an axis. Each of the connector assemblies has a first contact portion to be connected to a mating connecting member that includes a second FPC, and a second contact portion to be connected to one end of the electroconductive member in the coupling member.

BRIEF DESCRIPTION OF THE DRAWINGS

FIG. 12A is a top plan view showing a hinge connector according to a third embodiment of the present invention;

FIG. 12B is a front view of the hinge connector of FIG. 12A;

FIG. 12C is a sectional view taken across all connectors shown in FIG. 12A;

DESCRIPTION OF THE PREFERRED EMBODIMENTS

Before describing embodiments of the invention, a hinge connector according to a prior art will be described with reference to FIG. 1 in order to facilitate understanding of the invention.

Figure 1:
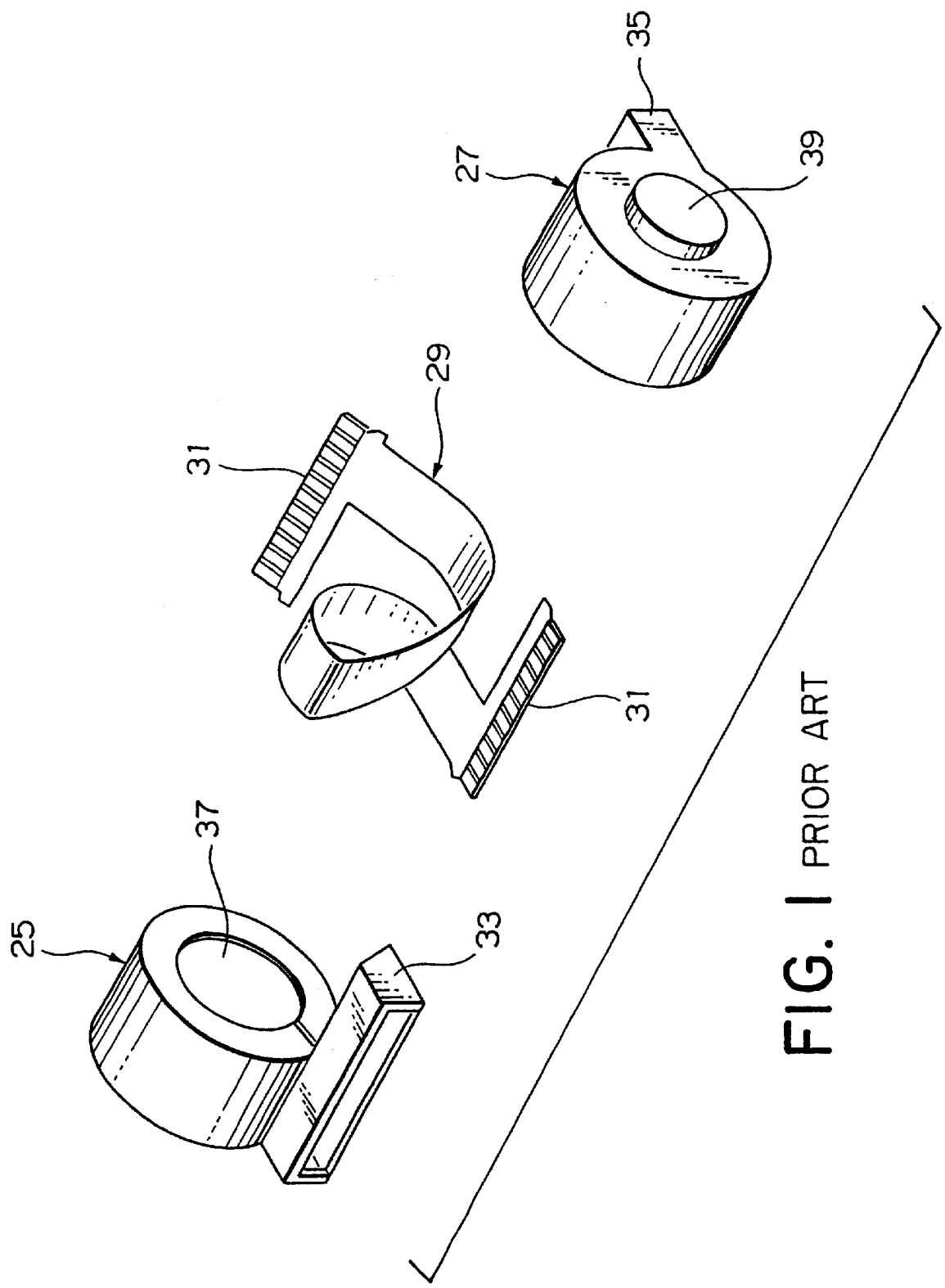
FIG. 1 is a perspective view showing a conventional example of a hinge connector.

Referring to FIG. 1, a conventional hinge connector has a structure in which a flexible electroconductive member 29 in the form of a thin sheet is installed in a first cylindrical component 25 and a second cylindrical component 27 that is rotatably installed to the first cylindrical component 25. In the structure, a connection 31 at one end of the electroconductive member 29 is connected to a connector of one portion (not shown) via an opening 33 of the cylindrical component 25 while a connection 31 at the other end is connected to a connector of the other portion via an opening 35 of the cylindrical component 27.

In FIG. 1, reference numeral 37 denotes an opening for accommodating the electroconductive member 29, and reference numeral 39 denotes a rotational shaft of the cylindrical component 27.

The foregoing conventional hinge connector has been posing problems described below when connecting the connections of the electroconductive member to associated connectors of portions via the connections of the cylindrical components 25 and 27. Although the electroconductive member 29 is formed flexible in a direction of thickness of a thin sheet, it is difficult to bend the member in a direction orthogonal to the thickness, i.e., in a direction of its width. On the other hand, when connections of the electroconductive member 29 is connected or fitted to the connectors of the portions, the electroconductive member 29 is bent to a certain degree in the direction of its width in addition to the direction of its thickness; hence, forcible connection or fitting leads to damage such as out or breakage of the electroconductive member in some cases. The damage sometimes occurs when one portion is rotated with respect to the other portion in using electronic equipment.

Furthermore, if the electroconductive member 29 is given one turn and installed as shown in FIG. 1, then the turned portion bulges. Taking the bulge into account in a design stage has inevitably increased a hinge diameter, or the turn has caused the turned portion to shrink or expand. Consequently, rubbing has taken place in the electroconductive member, leading to a shortened service life of the hinge.

In addition, a repulsive force of the electroconductive member 29 is generated by bending it widthwise and is relatively large so as to cause a crack in the connector of a mating portion or a disconnection of or damage to a soldered portion between the connector and a circuit board thereof in some cases. Especially, in recent years, because hinge connectors are increasingly becoming smaller and thinner due to a further reducing thickness of electronic equipment, such as portable telephones and personal computers, the problems described above are becoming more obstructive.

Embodiments of the invention will now be described in conjunction with the accompanying drawings.

First Embodiment

Figure 2:
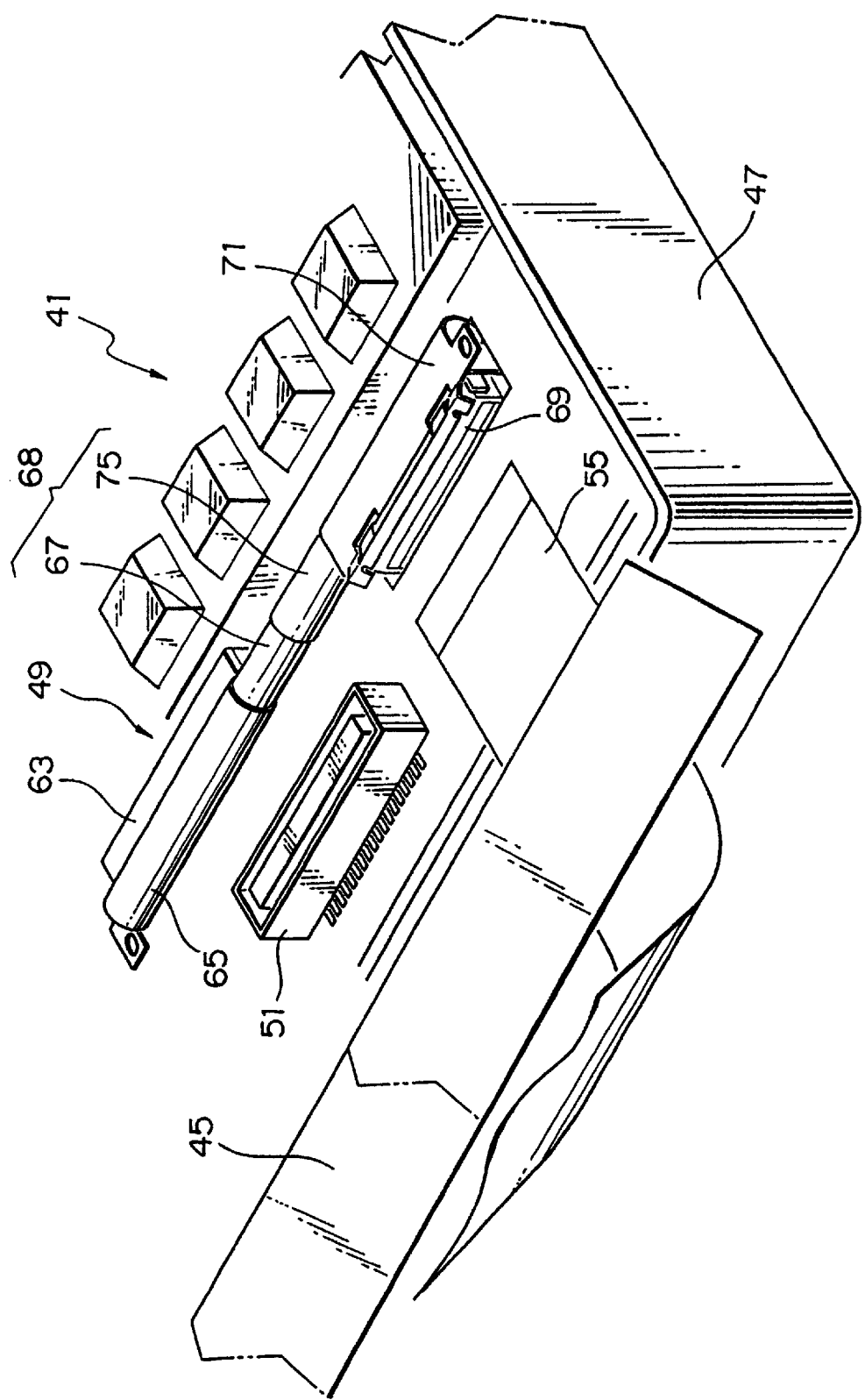
FIG. 2 is a perspective view of an essential section showing an example wherein a first embodiment of a hinge connector has been employed for an electronic equipment in accordance with the present invention.
Figure 3:
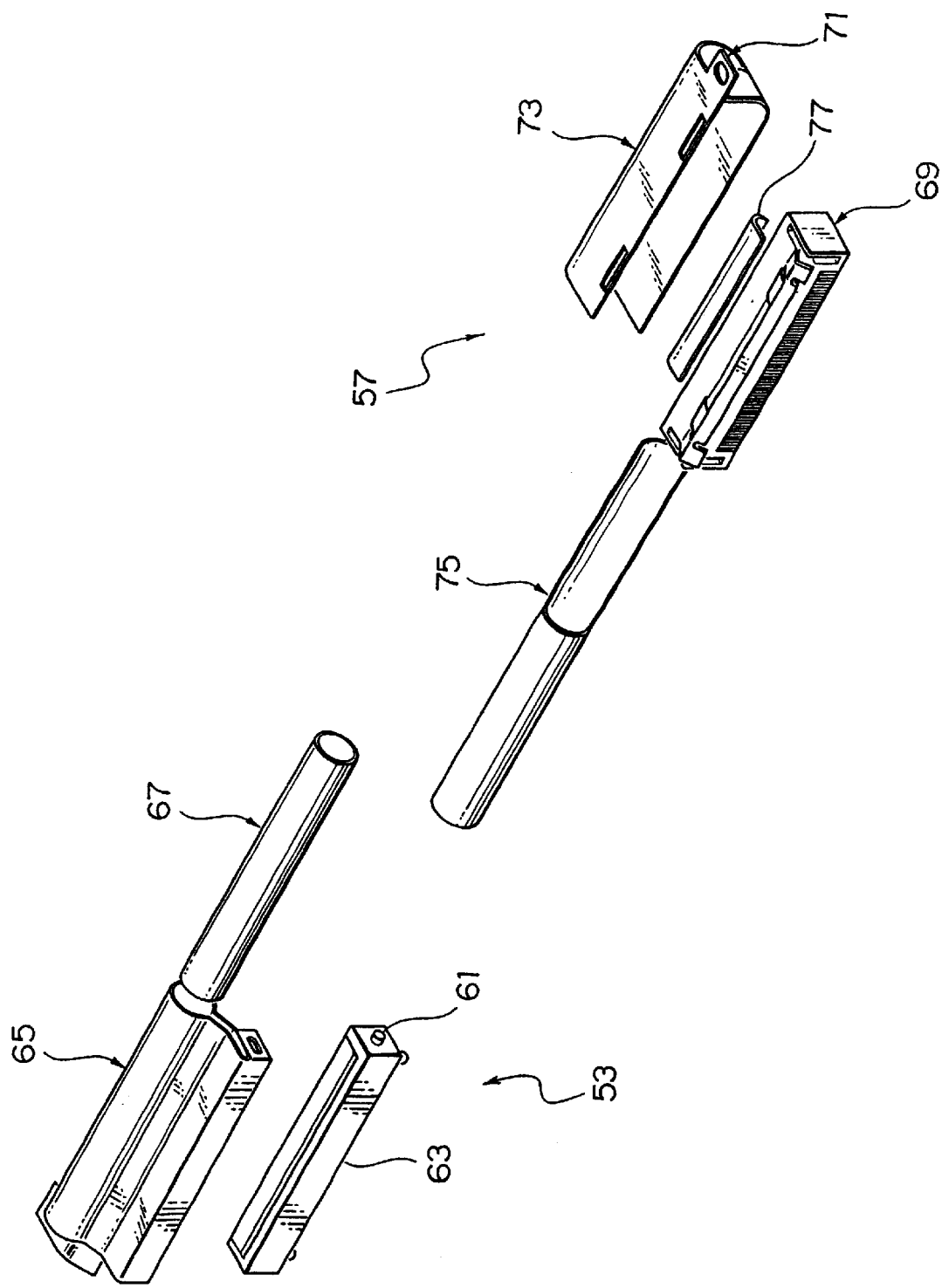
FIG. 3 is an exploded perspective view of the hinge connector shown in FIG. 2 in accordance with the present invention.

Referring to FIG. 2, a hinge connector 49 according to a first embodiment of the present invention is employed for a notebook personal computer, which is one of electronic equipment. A notebook personal computer 41 consists of a liquid crystal display (LCD) 45 for screen display and a computer main unit 47 to which the LCD 45 is rotatably installed. The LCD 45 is electrically connected to the computer main unit 47 via the hinge connector 49. The following embodiment will show an example wherein the notebook personal computer is used as electronic equipment; however, it is obvious that electronic equipment to which the hinge connector 49 in accordance with the present invention can be applied is not limited to a notebook personal computer.

The hinge connector 49 is constructed primarily by a main unit connector assembly 53 to be connected to a connector 51 provided on the computer main unit 47, an LCD connector assembly 57 to which an FPC 55 from a circuit (not shown) of the LCD 45 is connected, and an electroconductive member 59 installed in the main unit connector assembly 53 and the LCD connector assembly 57 (see FIG. 4 through FIG. 7).

The main unit connector assembly 53 is constructed primarily by a main unit connector 63 in which a rotary shaft 61 is formed, a shell 65 to be fitted to the main unit connector 63, and a pipe 67 provided on one end of the shell 65. The LCD connector assembly 57 is constituted primarily by an LCD connector 69, a shell 73 in which a reinforcing piece 71 is formed, a pipe 75, and a ground plate 77. The pipe 67 and the pipe 75 make up a coupling member.

The main unit connector 63 has a contact 79 to be connected to the electroconductive member 59. The LCD connector 69 has a continuity terminal 81 for connection between the electroconductive member 59 and the FPC 55.

The shells 65 and 73, and the ground plate 77, etc. are made of an electroconductive material. The outside diameter of the pipe 67 is made slightly smaller than the inside diameter of the pipe 75, so that the pipe 67 can be rotatably accommodated in the pipe 75 when the main unit connector assembly 53 and the LCD connector assembly 57 are installed.

Figure 4A:
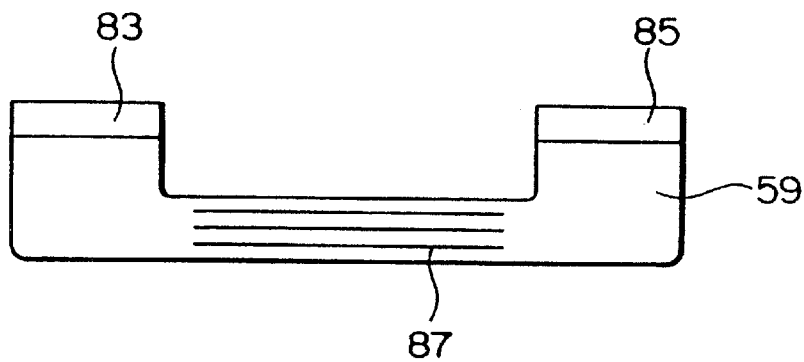
FIG. 4A is a top plan view showing an electroconductive member constituting the hinge connector of FIG. 3.
Figure 4B:
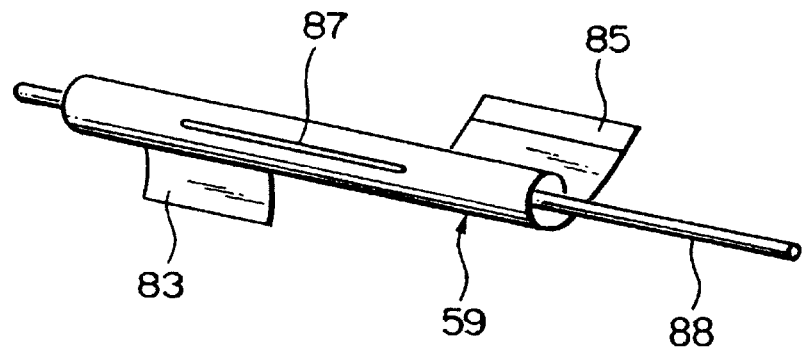
FIG. 4B is a perspective view illustrating a procedure for folding the electroconductive member into a cylindrical shape.
Figure 4C:
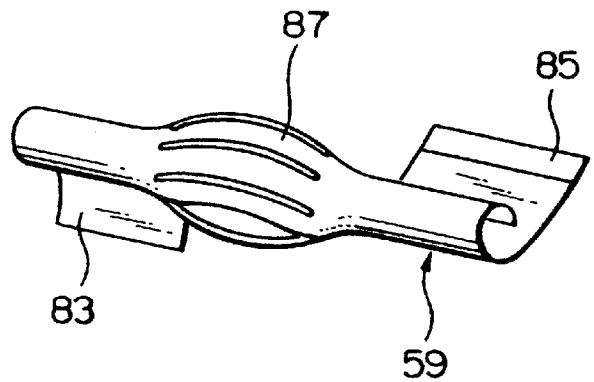
FIG. 4C is a perspective view illustrating a state in which the electroconductive member has been axially deformed and folded into the cylindrical shape.

Referring to FIGS. 4A, 4B, and 4C, the electroconductive member 59 is composed of a thin-sheet FPC. Broad connections 83 and 85 are formed on both ends of the electroconductive member 59. A flexible portion 87 is provided between the connections 83 and 85. The flexible portion 87 has a plurality of slits that extend in a direction for connecting the connections 83 and 85. The FPC constitutes the electroconductive member 59 and includes a plurality of wires or conductive thin film lines (not shown). The slits are formed among the wires. Furthermore, the connections 83 and 85 include terminals associated with the wires. The electroconductive member 59 is not limited to the wound FPC, and one that has been formed into a cylindrical shape beforehand may be used instead, as it will be described hereinafter. Further alternatively, a folded FPC may be employed, for example, which will be described in conjunction with FIGS. 14 and 15. As the electroconductive member, a discrete wire may be used in place of the one employing an FPC.

Description will be made as regards an assembly procedure for the hinge connector according to the first embodiment of the present invention having the configuration described above.

As shown in FIG. 4B, for example, the electroconductive member 59 is wound about a shaft member 88 having a small diameter in a direction substantially orthogonal with respect to a lengthwise direction to form it into a cylindrical shape. After the winding, the shaft member 89 is removed. The cylindrical electroconductive member 59 is formed by the winding and has flexibility to be freely deformed in the rotating direction as a matter of course and in the lengthwise direction owing to the slits in the flexible portion 87 as shown in FIG. 4C.

Figure 5A:
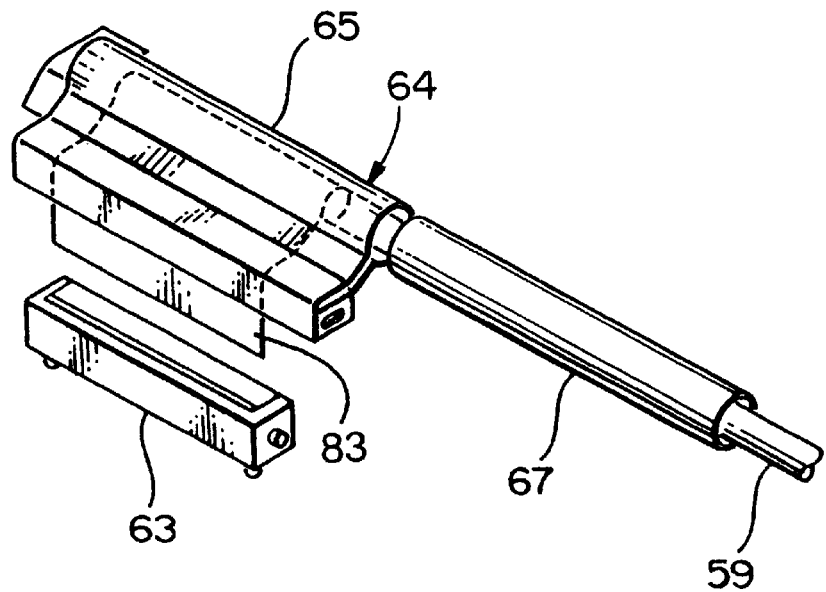
FIG. 5A is a perspective view of an essential section illustrating a state wherein the hinge connector of FIG. 3 is being connected to a board connector.
Figure 5B:
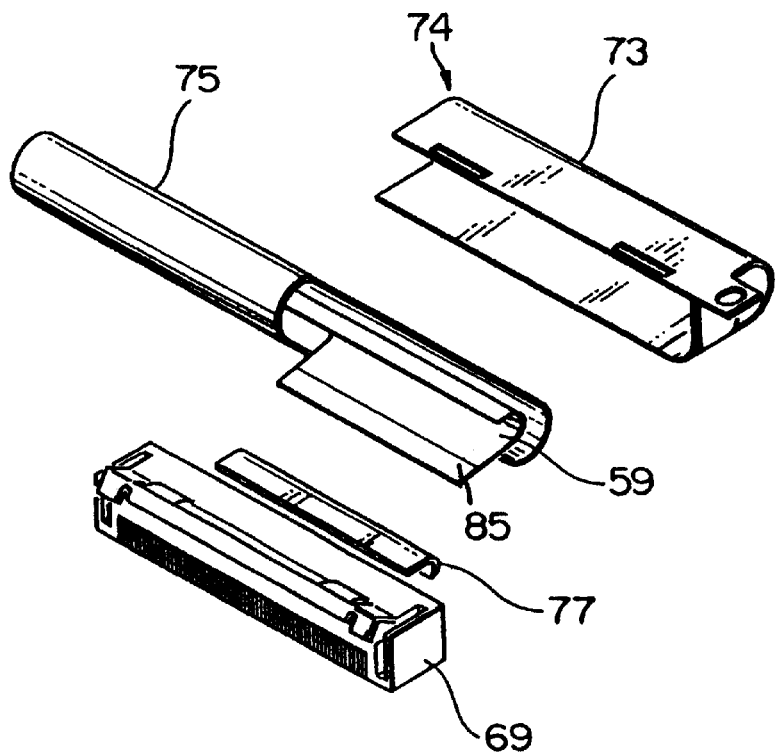
FIG. 5B is a perspective view of an essential section illustrating a state wherein the hinge connector is about to be connected to an LCD connector.

Subsequently, the electroconductive member 59 is formed into the cylindrical shape as described above and is placed in the shell 65 from one end of the shell 65 of the main unit connector 53, then inserted in the pipe 67 as illustrated, for example, in FIG. 5A. At this time, the connection 83 is to be set out of the shell 65 toward the main unit connector 63.

Subsequently, the electroconductive member 59 is placed on the opposite side from that inserted in the pipe 67 and is inserted in the pipe 75 of the LCD connector assembly 57 in a similar manner, setting the connection 85 out through an opening of the pipe 75. In the illustrated embodiment, an entire one surface of the connection 85 of the electroconductive member 59 provides a ground portion.

Figure 6:
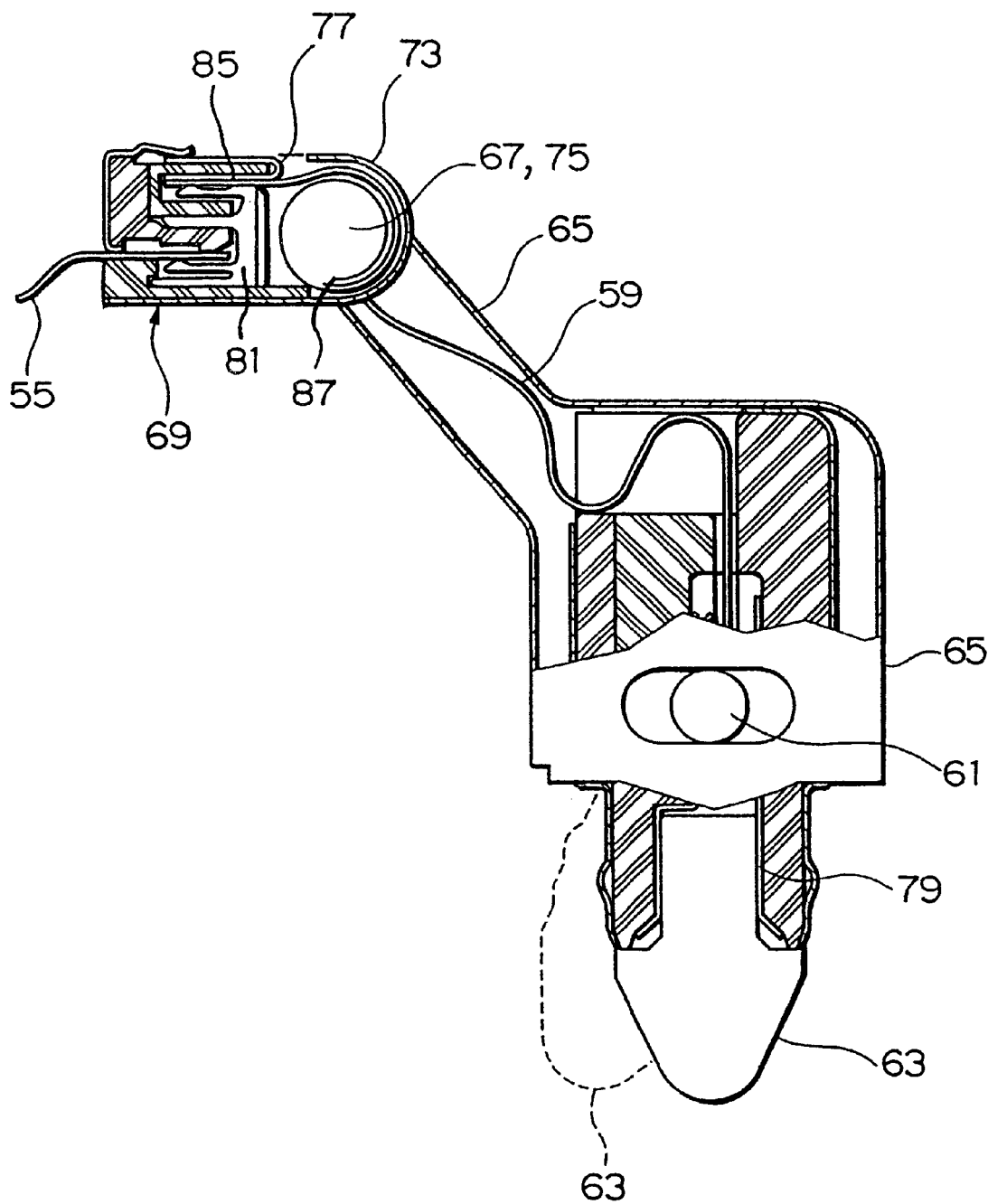
FIG. 6 is a sectional view of an essential section illustrating a state wherein the hinge connector of FIG. 3 has been connected to the board connector and the LCD connector.
Figure 7:
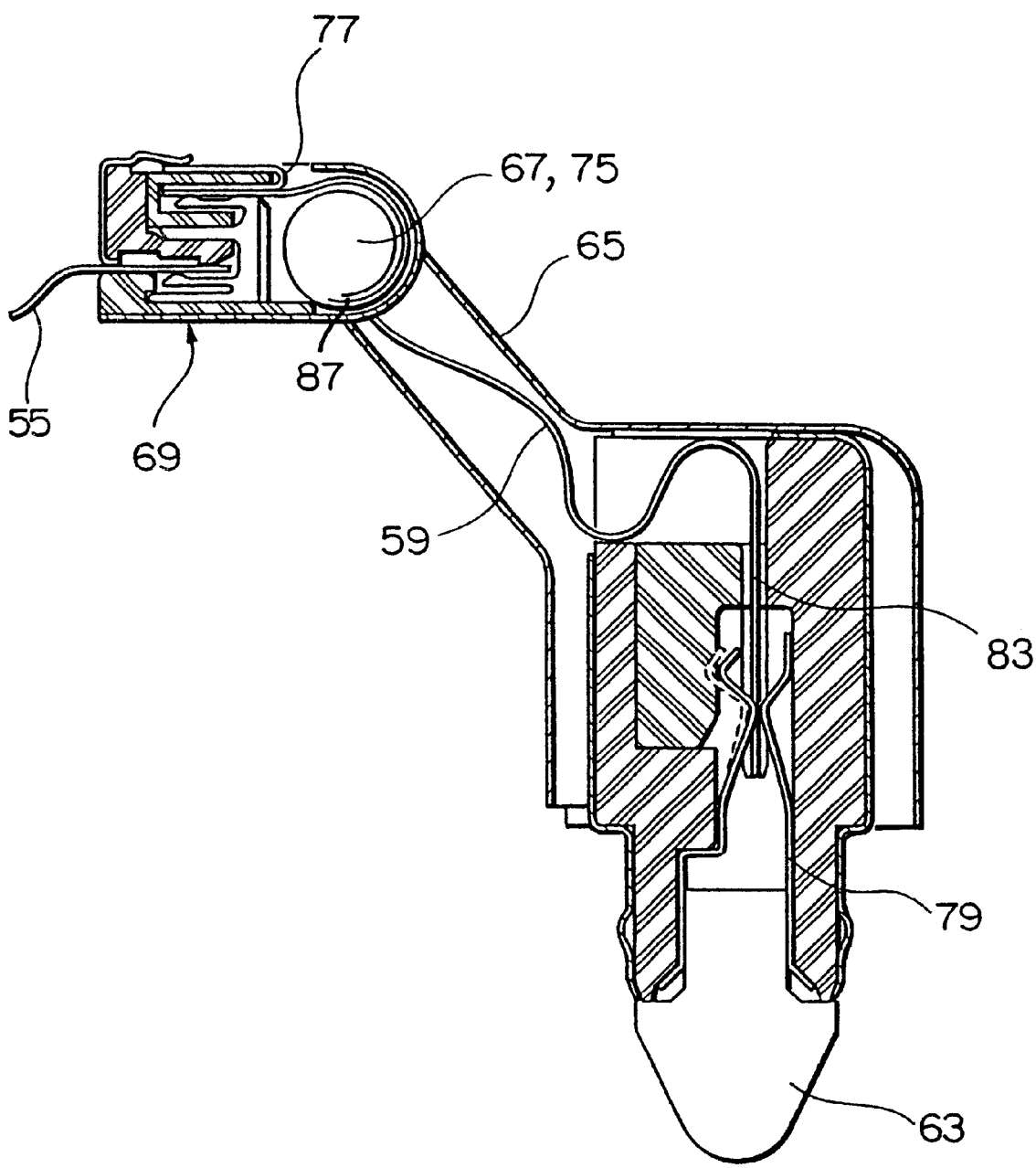
FIG. 7 is a complete sectional view showing a state wherein the hinge connector of FIG. 3 has been connected to the board connector and the LCD connector.

Referring further to FIG. 6 and FIG. 7, the connection 83 of the electroconductive member 59 is connected to the main unit connector 63. At this time, the connection 83 is connected to the contact 79 of the main unit connector 63 such that a certain amount of play or slack is provided relative to the flexible portion 87. This arrangement prevents the connection 83 from being unduly pulled even if the connection 83 is pulled toward the connector when the main unit connector 63 moves about the rotary shaft 61 from a position indicated by a solid line to a position indicated by a dashed line in FIG. 6 in a state wherein the connection 83 is in connection to the main unit connector 63.

The connection 85 of the electroconductive member 59 is connected to the LCD connector 69. At this time, the ground plate 77 is installed together with the connection 85 to the LCD connector 69 such that the ground plate 77 is positioned on the ground portion. Furthermore, the shell 73 is installed to an outer periphery of the LCD connector 69 from outside the pipe 75.

The hinge connector 49 is formed by combining mainly the main unit connector assembly 53, the LCD connector assembly 57, and the electroconductive member 59 and is coupled to the notebook personal computer by connecting the main unit connector 63 of the main unit connector assembly 53 to the connector 51 of the computer main unit 47 and by connecting the FPC 55 of the LCD 45 to the LCD connector 69 of the LCD connector assembly 57.

In the hinge connector 49 according to the first embodiment described above, the electroconductive shell 73 is provided around the outer periphery of the connection 85 of the electroconductive member 59; hence a shield can be formed in the LCD connector 69 to make it possible to improve EMI characteristics.

In the state wherein the main unit connector assembly 53, the LCD connector assembly 57, and the electroconductive member 59 have been assembled to constitute the hinge connector 49, the connections 83 and 85 are in connection to the main unit connector 63 and the LCD connector 69, and the electroconductive member 59 is in a floating state therebetween. With this arrangement, when the hinge connector 49 is installed in the notebook personal computer and the LCD 45 is rotated with respect to the computer main unit 47, or when the main unit connector 63 turns between the solid line and the dashed line in FIG. 6 with the hinge connector 49 connected to the connector 51 of the computer main unit 47, or in other similar situation, the electroconductive member 59 can be moved or displaced smoothly.

Second Embodiment

Figure 8:
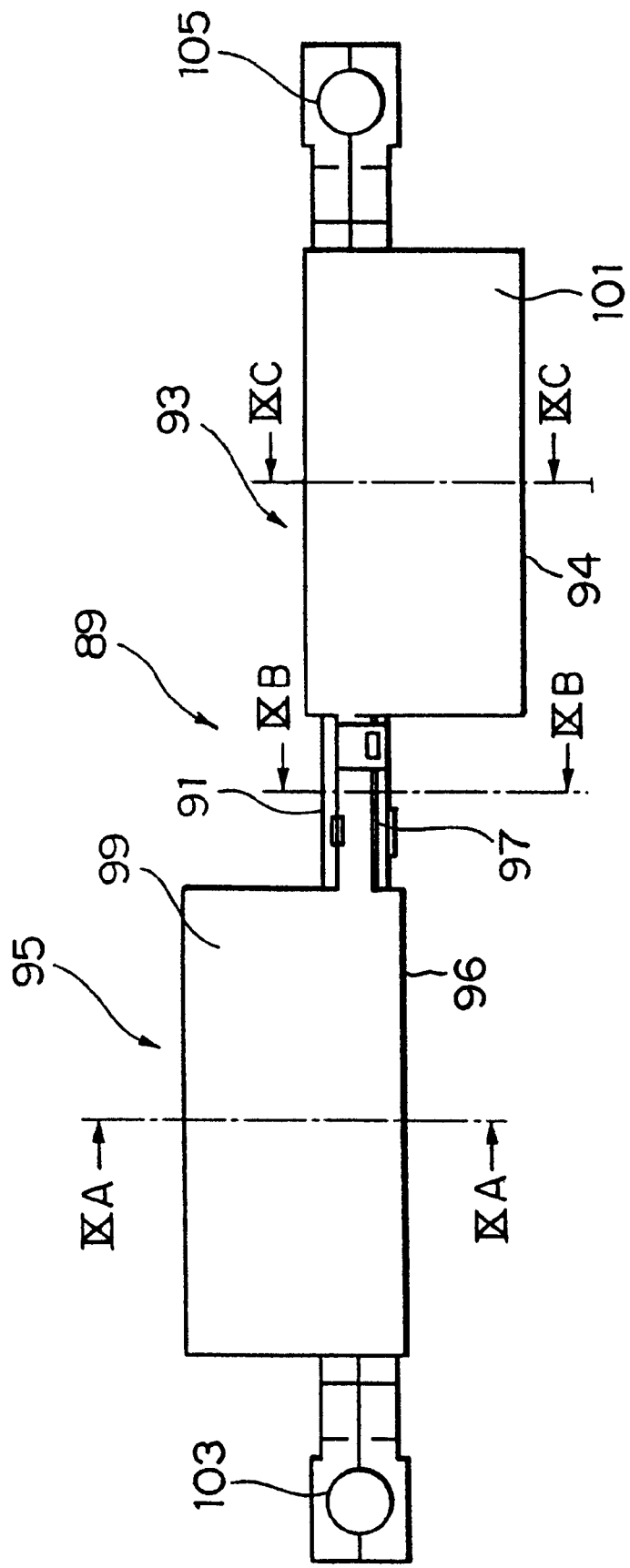
FIG. 8 is a diagram showing a hinge connector according to a second embodiment of the present invention.
Figure 9:
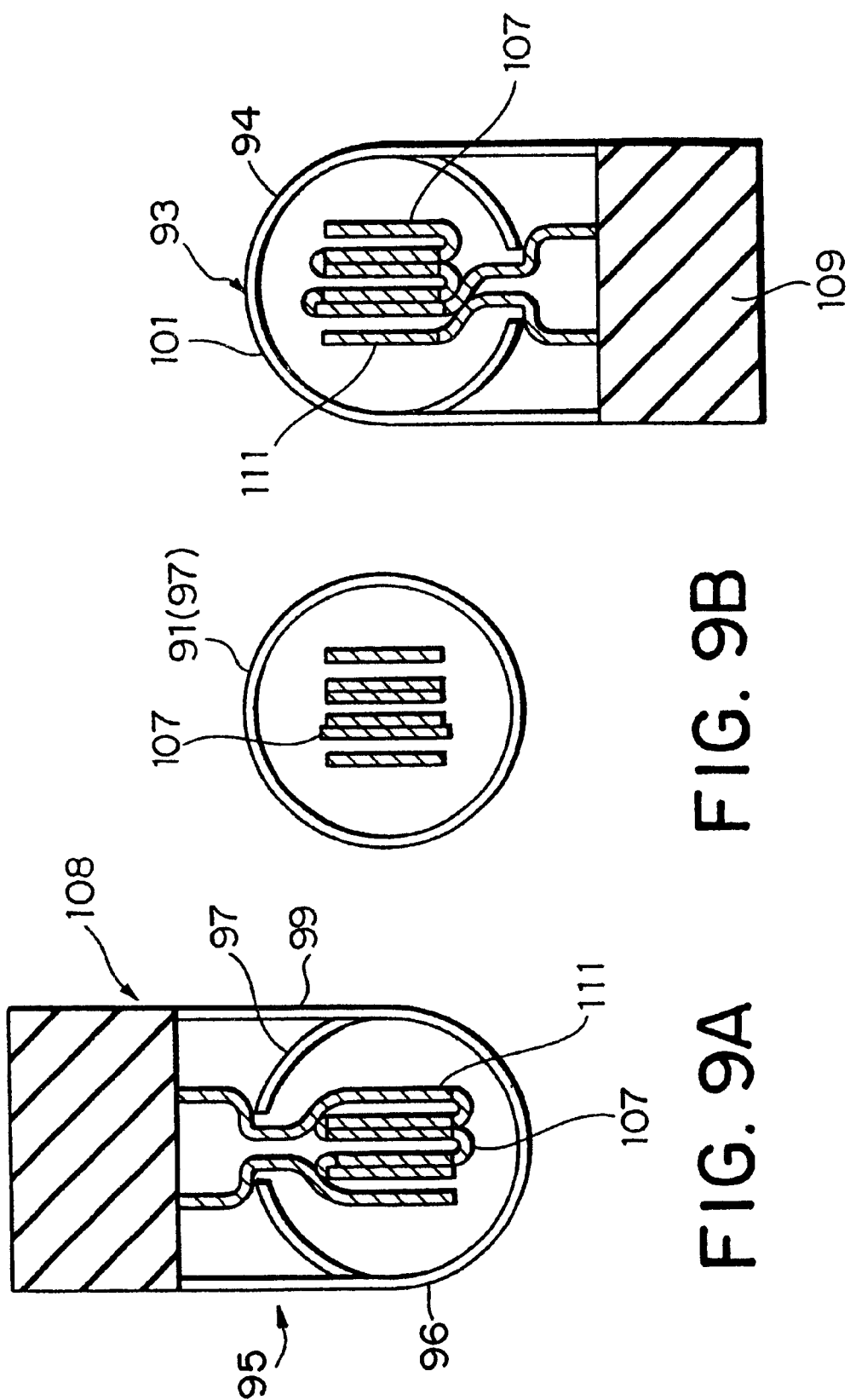
FIG. 9A is a sectional view taken along the line IXA—IXA of FIG. 8.
FIG. 9B is a sectional view taken along the line IXB—IXB of FIG. 8.
FIG. 9C is a sectional view taken along the line IXC—IXC of FIG. 8.

Referring now to FIGS. 8 and 9, a connector 89 according to a second embodiment has an LCD connector assembly 93 connected via pipes 91 and 97 to a PC connector assembly 95 having the same shape as the LCD connector assembly 93. In the respective connector assemblies 93 and 95, shells 99 and 101 are formed around the pipes 91 and 97 such that they can rotate in a lengthwise direction and around an axis. Both ends of the pipes 91 and 97 have tapped holes 103 and 105 for installation onto a PC chassis.

In mounting portions where the tapped holes 105 and 103 are provided are formed, the pipes 91 and 97 and the shells 101 and 99 are integrally formed in the second embodiment.

However, as mentioned in the case of the first embodiment, the pipes 91 and 97 and the shells 101 and 99 may be formed separately. Further alternatively, the shells 101 and 99 and the mounting portions where the tapped holes 105 and 103 are provided may be formed into one piece, or the pipes 91 and 97 and the mounting portions where the tapped holes 105 and 103 are provided may be formed into one piece.

Insulators 108 and 109 facing openings of the shells 101 and 99, respectively, have a structure similar to that of the LCD connector 69 shown in FIGS. 6 and 7; however, the structure is not shown.

Figure 10:
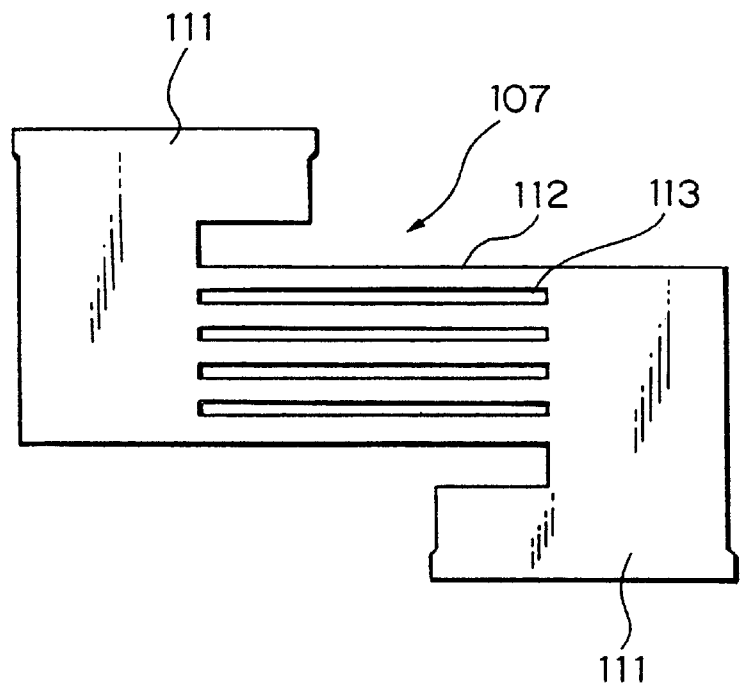
FIG. 10 is a top plan view showing an electroconductive member of the hinge connector of FIG. 8.

As illustrated in FIG. 10, before the electroconductive member 107 is folded, the electroconductive member 107 is substantially S-shaped. The electroconductive member 107 has a plurality of wires (not shown) and a plurality of slits 113 which penetrate a flexible portion 112 in its thickness direction and extend in its lengthwise direction among the wires.

Figure 11:
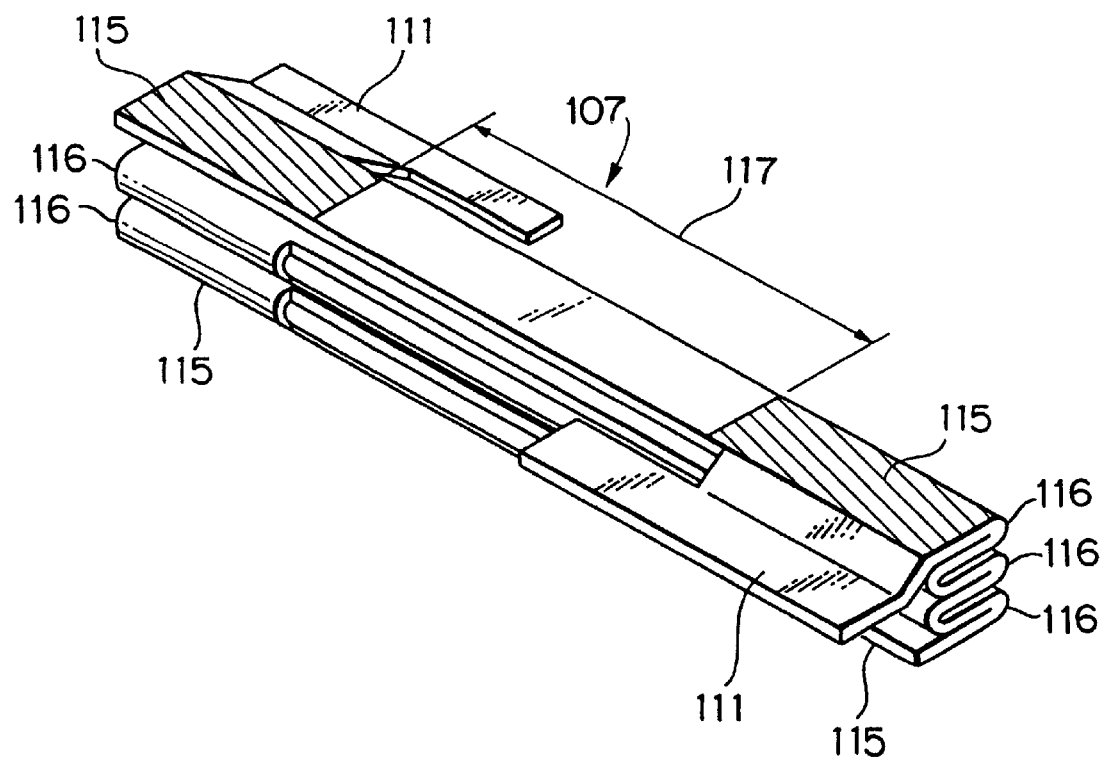
FIG. 11 is a perspective view showing a state wherein the electroconductive member of FIG. 10 has been folded to be accommodated.
Figure 13A:
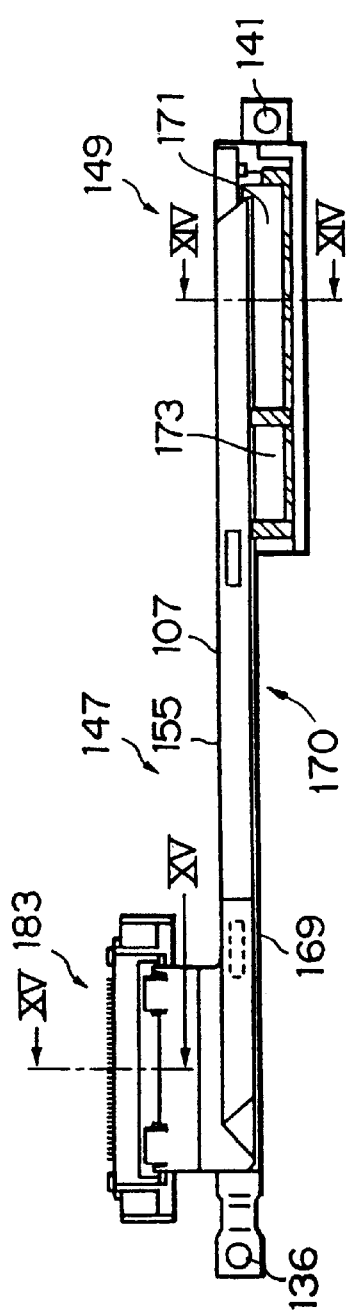
FIG. 13A is a front view showing a hinge connector according to a fourth embodiment of the present invention.
Figure 13B:
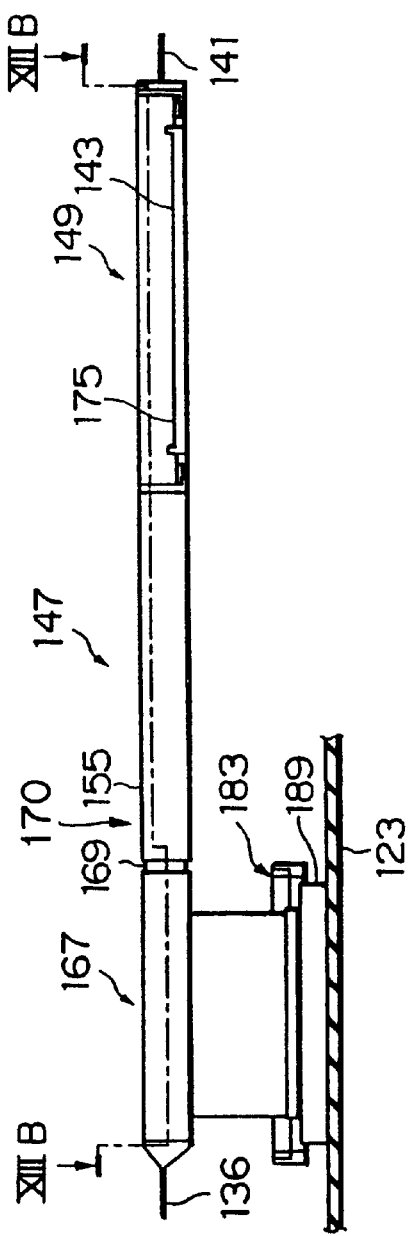
FIG. 13B is a front view of the hinge connector of FIG. 13A.
Figure 13C:
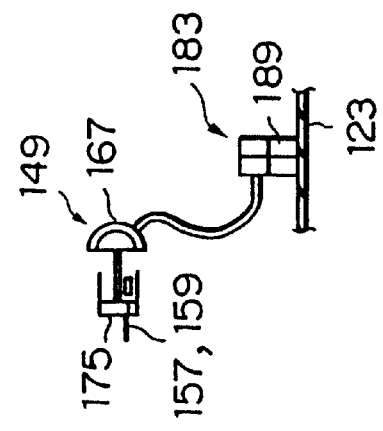
FIG. 13C is a sectional view taken across a connector section shown in FIG. 13A.

As illustrated in FIG. 11, after the electroconductive member 107 is folded, connection terminals 111 are formed near both ends, respectively.

The folded electroconductive member 107 has flexibility to be freely deformed in the rotating direction and the lengthwise direction owing to the slits 113 in the flexible portion 112. Fixing surfaces 115 are formed at top and bottom sides. The way the electroconductive member 107 is folded is not limited to that illustrated as long as the connecting terminals are formed on opposite zigzag ends from each other.

Reference numeral 117 indicates a range wherein the connector assemblies can move.

Third Embodiment

Referring now to FIGS. 12A, 12B, and 12C, a hinge connector 119 according to a third embodiment includes an LCD connector assembly 121 to be connected to an LCD board, a PC (main unit) connector assembly 127 to be connected to a socket connector 125 provided on a board 131 of the PC main unit, and a shell 131 connected to the PC connector assembly 127 via a flexible flat cable or a flexible wiring board (both will be hereinafter referred to simply as "FPC") 129. The shell 131 has a projecting pipe 133 at one end and a tapped hole 136 at the other end for screwing the shell 131 onto an LCD chassis. The PC connector assembly 127 is shaped for a distal end of the FPC 129 to be inserted and secured therein.

As in the first embodiment, the LCD connector assembly 121 includes a pipe 135, a shell 137 provided around the pipe 135, and a fixing section 139 for securing the FPC. The pipe 135 opens at an end to be connected to the LCD connector assembly 121 and is to be fitted to the PC pipe 133. One end of the pipe 135 is semi-cylindrical.

The shell 137 has, on its one end, a tapped hole 141 for screwing the shell 137 onto a chassis. The pipe 133 and the pipe 135 make up a coupling member that can be rotated about an axis and expanded or contracted lengthwise.

The third embodiment differs from the first embodiment in that two types of FPCS, namely, the flexible flat cable or the flexible wiring board (FPC) 143 for connection to a fixing section 139 of the LCD connector assembly 121 connected to a connection end of an electroconductive member (not shown) and a flexible flat cable or a flexible wiring board (FPC) 145 for an inverter, are arranged widthwise and drawn out in two rows.

The third embodiment, however, provides the same operations and advantages as those of the first embodiment. Moreover, a ground is provided by fixing to the LCD chassis via the shell, making it possible to provide a hinge connector exhibiting outstanding EMI characteristics.

Fourth Embodiment

Referring to FIGS. 13A, 13B, 13C, 14A and 14B, an LCD connector assembly 149 of a hinge connector 147 in accordance with a fourth embodiment includes a shell 151, and an insulator 153 surrounded by the shell 151, and also includes therein a pipe 155 that is partly semi-cylindrical as in the case of the first embodiment.

The insulator 153 incorporates a contact 161 having two contact sections and two support sections arranged alternately on both sides of its center. These four sections project toward ends where FPCs 157 and 159 are inserted.

The insulator 153 also has an opening 163 through which the contact sections and the support sections of the contact 161 at the center are observed. The uppermost contact section of the contact 161 has sheet-like ends 171 and 173 that are arranged parallel to each other with a widthwise interval provided therebetween, combined into one piece in a pipe of an electroconductive member 107, and mechanically and electrically connected. The ends 171 and 173 of the electroconductive member 107 are connected to the FPC 157 for connection to an LCD and the FPC 159 for connection to an inverter, respectively. The electroconductive member 107 is bent zigzag a plurality of times in alternately opposite directions widthwise, and accommodated in a pipe 155 via a support member 165. This arrangement allows floating in an axial direction of the pipe 155 and also permits a hinge diameter to be reduced.

The structure, wherein the electroconductive member 107 is held via the support member 165, is employed also in a main unit connector 167. The electroconductive member 107 has slits and is simply folded in multiple layers (see FIGS. 14 and 15), thus providing axial floating, smooth rotation of the hinge, and high hinge rotation durability.

The pipe 155 and the pipe 169 make up a coupling member for accommodating the electroconductive member that is axially rotatable and axially extensible.

A fixing member 175 includes a metallic outer cover 177 covering an outer surface thereof and a holding piece 181 that has a spring piece 179 at bottom thereof and a projecting triangular distal end.

Figure 14A:
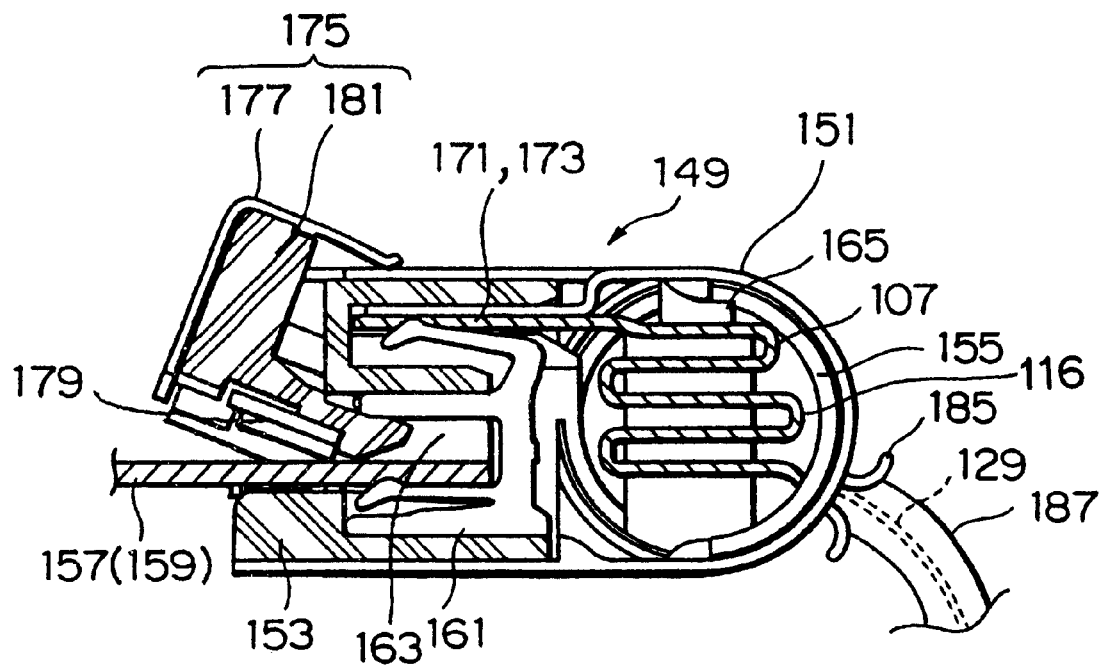
FIG. 14A is a sectional view showing a portion along the line XIV—XIV of FIG. 13B, and also showing a state before fixing or when detaching an FPC.
Figure 14B:
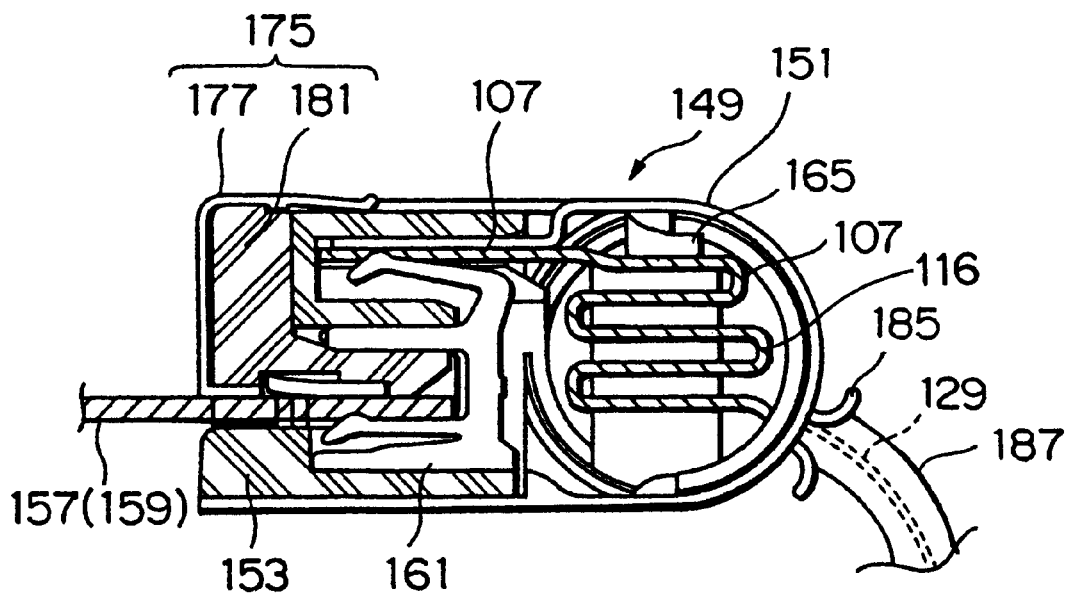
FIG. 14B is a sectional view showing a portion along the line XIV—XIV of FIG. 13B, and also showing a state wherein the FPC has been fixed.

As illustrated in FIG. 14A, the FPCs 157 and 159 are first inserted in the opening 163 of the insulator 153, then the holding piece of the fixing member 175 is inserted thereby to cause the upper sides of the FPCs 157 and 159 to come in contact with the spring piece 179, while the lower sides thereof are pressed against a contact portion of the contact. Thus, the FPCs 157 and 159 are fixed as illustrated in FIG. 14B.

The fourth embodiment provides exactly the same operations and advantages as those of the embodiments described above although the shape of a PC connector assembly 183 is slightly different. Reference numeral 185 in the drawings denotes an opening formed in the shell 151 of the PC connector assembly 183 at the other end of the connector, and an FPC 187 is drawn out therethrough.

Figure 15A:
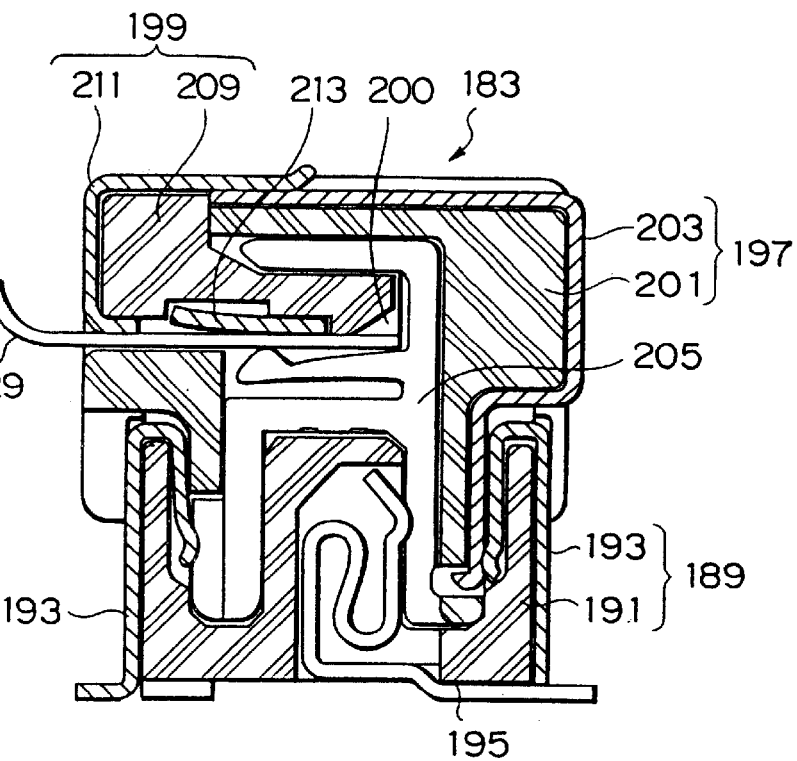
FIG. 15A is a sectional view primarily showing a PC connector section of the hinge connector according to the fourth embodiment, and also primarily showing a signal contact.
Figure 15B:
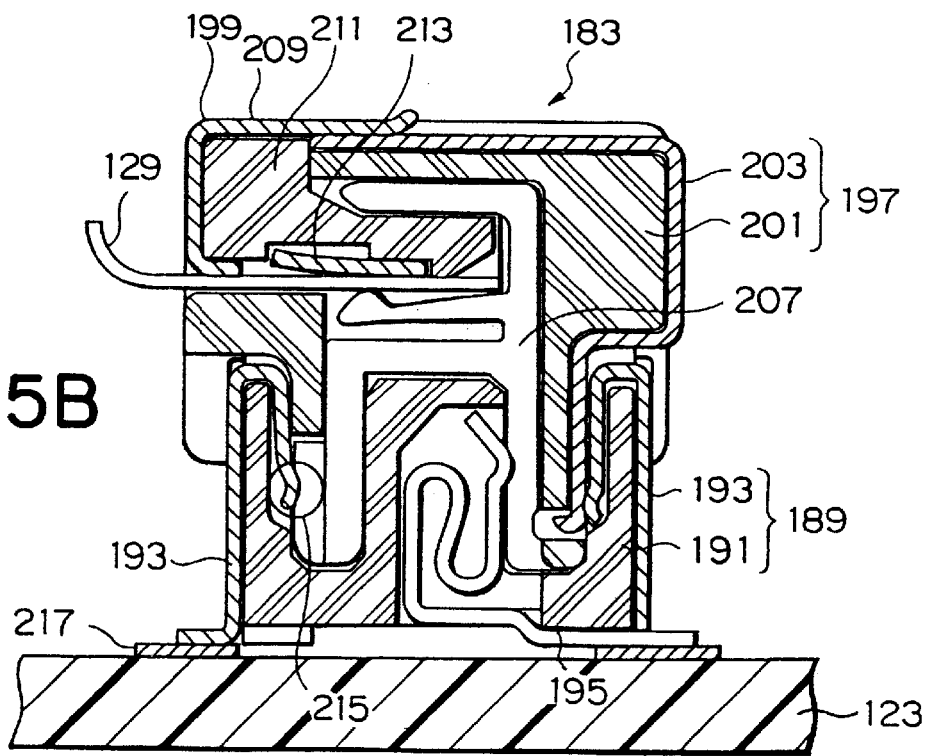
FIG. 15B is a sectional view primarily showing a PC connector section of the hinge connector according to the fourth embodiment, and also primarily showing a ground contact.

FIG. 15 is a sectional view primarily showing the PC connector assembly 183 of the hinge connector in accordance with the fourth embodiment of the present invention, wherein FIG. 15A is a sectional view mainly showing a signal contact, and FIG. 15B is a sectional view mainly showing a ground contact. FIGS. 15A and 15B show a state wherein a socket connector 189 to be connected to a board has been provided on a board 123 of the PC main unit, and the PC connector assembly (hereinafter referred to simply as a "plug connectors") 183 has been fitted therein from above.

The socket connector 189 has an insulator 191 which is formed of an outer wall and central portion and has an opening, and a ground plate 193 provided so that it covers the outer periphery and outer wall of the insulator 191. At a center of the socket connector 189, a signal contact 195 is provided, one end of which is formed as a contact and bent in an S-shape from the contact, while the other end thereof extends along a bottom end of the socket connector 189 and projects outward.

The plug connector 183 to be fitted in the socket connector 189 includes a plug connector main body 197 and a fixing member 199. The plug connector main body 197 has an opening 200 at one end, an insulator 201, an outer cover 203 formed along an outer periphery of the insulator 201 excluding a side where the fixing member 199 is inserted, a signal contact 205 (FIG. 15A) having a contact portion for an FPC 129 and a contact portion for a contact of the socket connector, and a ground contact 207 (FIG. 15B). The signal contact 205 and the ground contact 207 are arranged widthwise freely or alternately according to an array of LVD3 signals.

The fixing member 199 includes an insulator 209 having a holding piece that projects in an L shape and an outer cover 211 covering the insulator 209, a spring member 213 being located under the holding piece.

In a state illustrated in FIG. 15A, when an FPC 129 is inserted in the opening 200 of the plug connector 183 to press-fit the holding piece of the fixing member 199, one surface of the FPC 129 is pressed by the spring member 213, and the other surface is fixed in contact with the signal and ground contacts.

One surface of the FPC 129 is connected to the spring member 213. The spring member 213 and the outer cover are electrically connected to each other. The outer cover 211 and an outer cover 203 are electrically connected to each other. Furthermore, connection to the socket connector 189, a surface ground (not shown) of the FPC 129, a plug connector 183, the shell 203, a ground plate 193 of the socket connector 189, and a ground pattern 217 of a main unit board 123 permits outstanding EMI performance to be achieved.

FIG. 15A shows a connection state of the signal contact 205, while FIG. 15B shows a connection state of the ground contact 207. The ground contact 207 shown in FIG. 15B contacts a portion indicated by reference numeral 215 to be electrically connected to the ground plate 193 of the socket connector 189.

Fifth Embodiment

Figure 16:
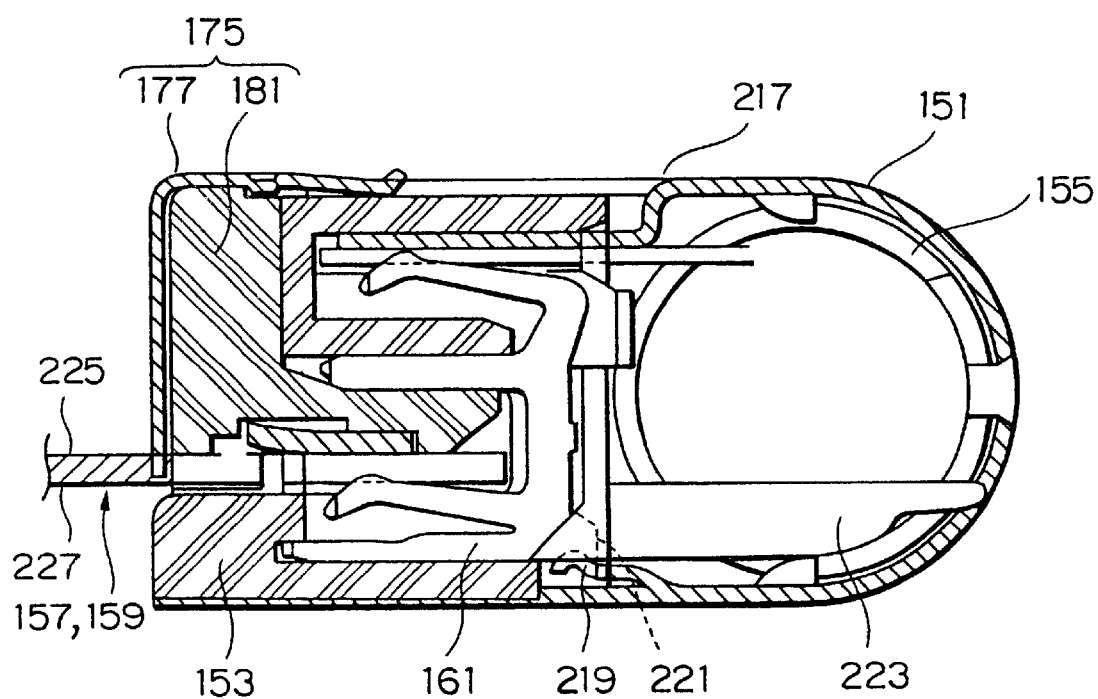
FIG. 16 is a sectional view showing an LCD connector of a hinge connector according to a fifth embodiment of the present invention.

Referring to FIG. 16, a hinge connector according to a fifth embodiment has the same configuration as that of the fourth embodiment except that an electroconductive member (not shown) wound in the same manner as described in the first embodiment is inserted in a pipe 155; hence, the description will not be repeated.

A ground contact 161 has a projection 221 to come in contact with a protuberance 219 of a shell. The hinge connector according to the fifth embodiment provides the same operations and advantages of the third embodiment.

Sixth Embodiment

Figure 17:
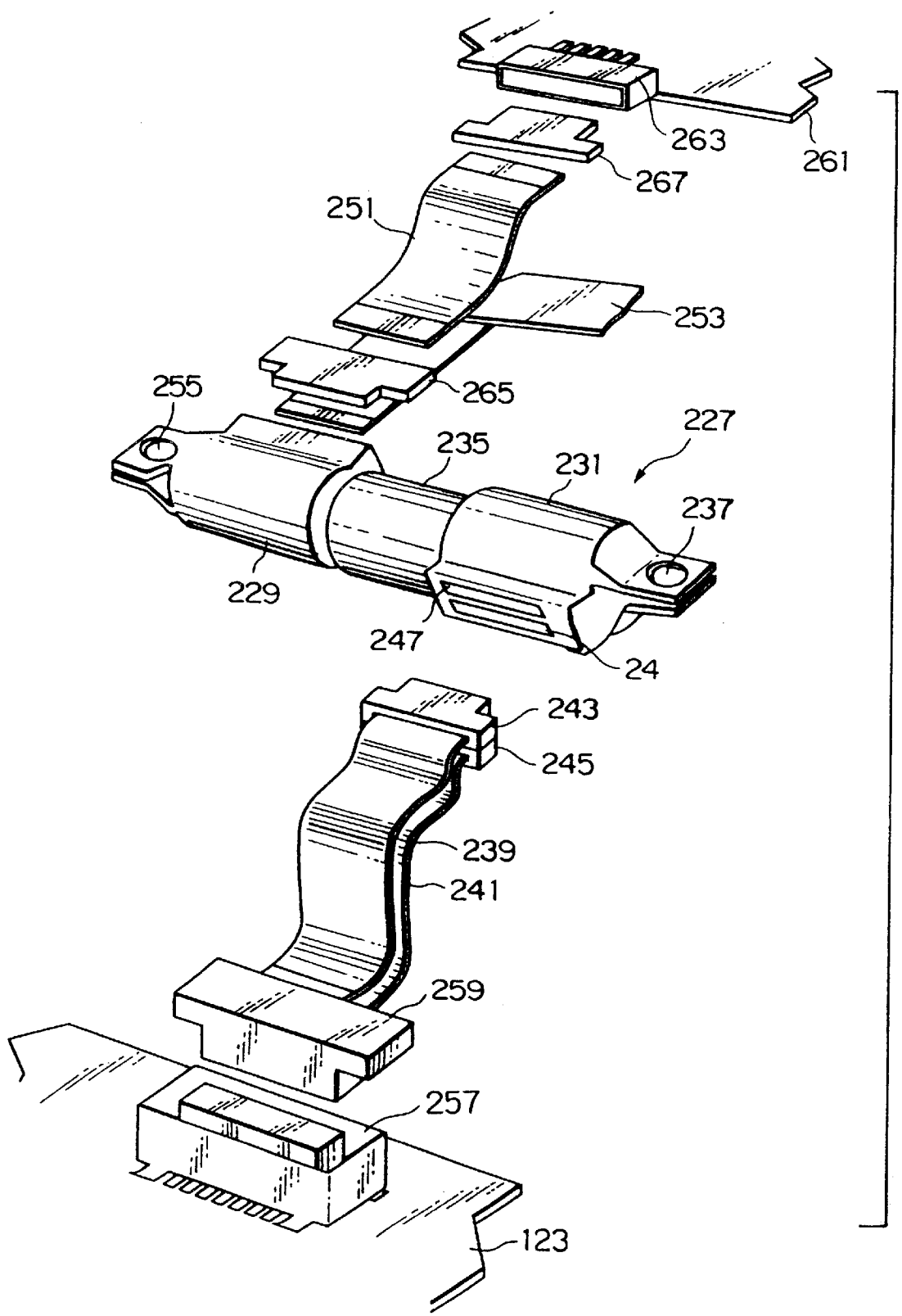
FIG. 17 is an exploded view showing connection of a hinge connector according to a sixth embodiment of the present invention.

Referring now to FIG. 17, a hinge connector 227 according to a sixth embodiment has an LCD connector assembly 229, a PC connector assembly 231, and a pipe assembly 235 serving as a coupling member for connecting the two assemblies. The PC connector assembly 231 has a tapped hole 237 for fixing on one end thereof, and openings 247 and 249 that are vertically arranged. Plug connectors 243 and 245 provided on ends of two FPCs 239 and 241, respectively, are fitted in the openings 247 and 249 to accomplish connection.

Likewise, an LCD connector assembly 229 is configured to have the openings (not shown) to be connected to two FPCs 251 and 253.

The pipe assembly 235 is also extensible as in the case of the first embodiment. Alternatively, a single pipe may be rotatably housed in any one of shells as long as it is extensible.

One end of each of the FPCs 239 and 241 has a plug connector 259 to be fitted in a socket connector 257 of a PC board, while the other ends thereof have plug connectors 243 and 245, respectively, which are inserted in the openings 247 and 249 of the PC connector assembly.

The plug connector 259 connected to the other ends of the FPCs 239 and 241 is capable of accommodating two FPCs in two vertical slots. The plug connector 259 is inserted in the socket connector 257 provided on a PC board 123.

The LCD connector assembly 229 is fixed by first inserting the FPC 251 to be connected to a connector 263 of an LCD board 261 and the FPC 253 for an inverter, then inserting a fixing member 265. One of the FPCs is for an inverter, and the other one is for connection to an LCD board. One end of each of the FPCs 251 and 253 is inserted to a pin connector 263 for FPC connection provided on the LCD board, and fixed by a fixing member 267. An electroconductive member may be a folded one as shown in the fourth embodiment or one that is wound to be a cylindrical shape as shown in the first embodiment as long as it has wires for the two FPCs 239 and 241 and housed in a pipe 22. The FPCs 251 and 253 may be of a type directly connected to the LCD connector assembly 229, and the fixing member 265 may serve as a connector.

Seventh Embodiment

Figure 18B:
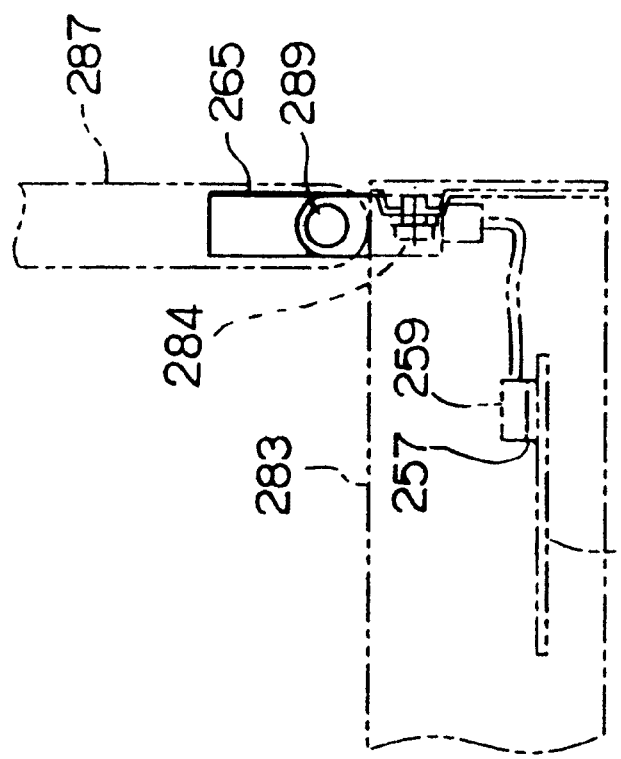
FIG. 18B is a diagram showing how the hinge connector of FIG. 18 is installed.
Figure 18A:
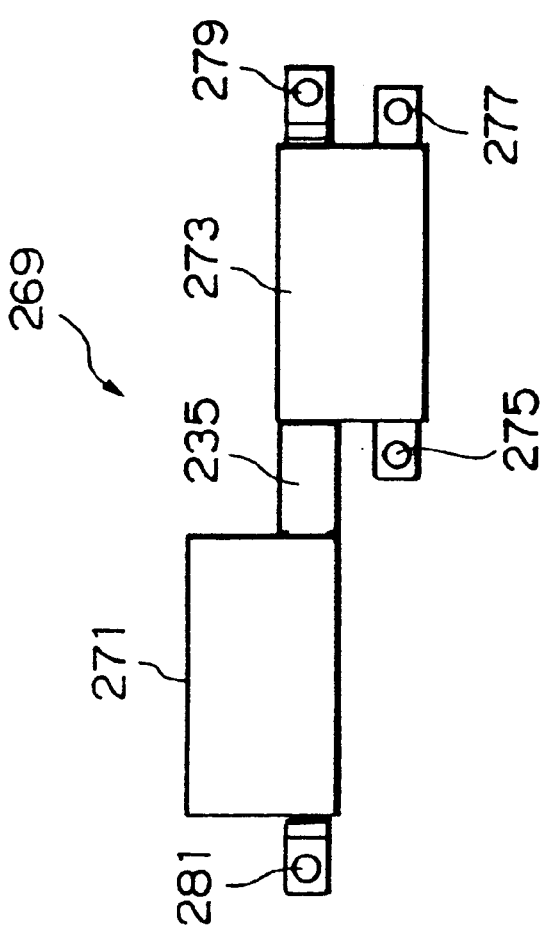
FIG. 18A is a top plan view showing a hinge connector according to a see nth embodiment of the present invention.
Figure 19:
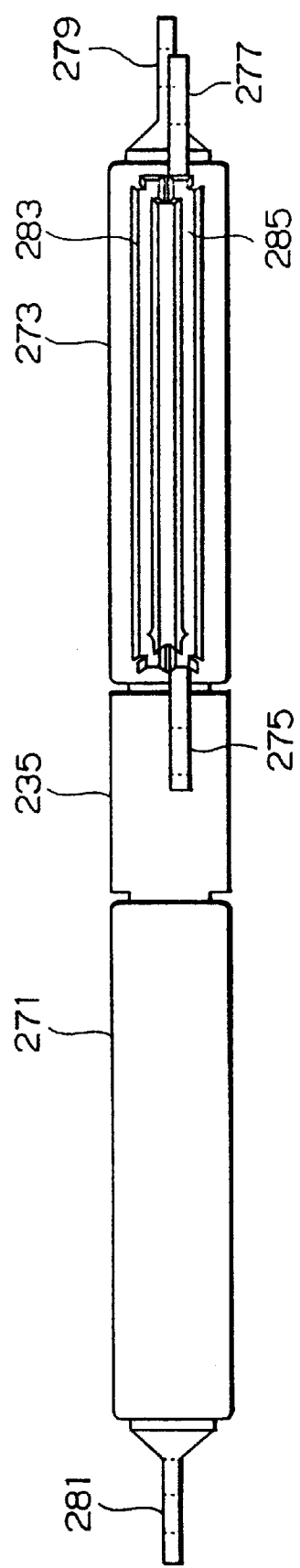
FIG. 19 is a front view of the hinge connector of FIG. 18A.
Figures 20A, 20B:
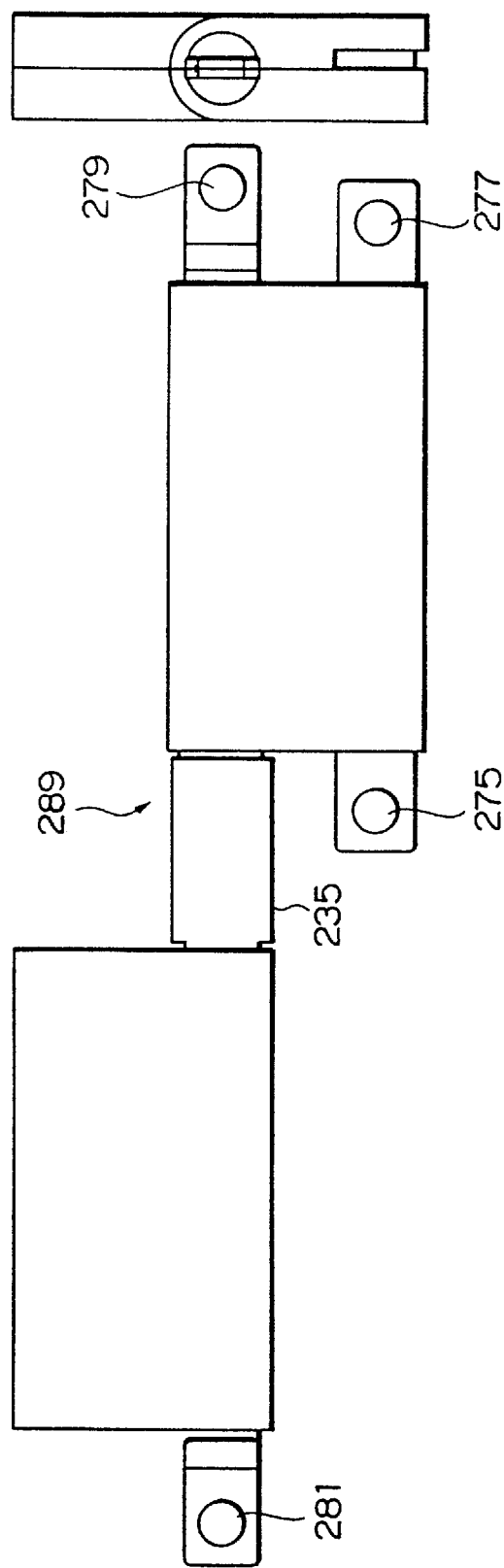
FIG. 20A is an enlarged top plan view of the hinge connector of FIG. 18A.
FIG. 20B is a side view of the hinge connector of FIG. 18A.

A hinge connector 269 shown in FIGS. 18 through 20 has the same configuration as the sixth embodiment shown in FIG. 17 except that the shapes of connectors and the coupling member are different.

Referring to FIGS. 18A, 19, and 20, an LCD connector assembly 271 has a slightly broad rectangular shape and includes an opening in its one end for mounting two FPCs (not shown).

A PC connector assembly 273 has tapped holes 275 and 277 formed in its outer shell.

As shown in FIG. 19, openings 283 and 285 are formed in two vertical rows to enable plug connectors 243 and 245 of FPCs 239 and 241 (see FIG. 17) to be respectively inserted therein.

Referring back to FIG. 18B, the hinge connector 269 is fixed to an portion 283 of a PC main unit by screws 284 through tapped holes 275 and 277, and also fixed to an LCD chassis of an LCD portion or a hinge clutch via tapped holes 281 and 279. As in the case of the hinge connector of the sixth embodiment shown in FIG. 17, a socket connector 257 is provided on a PC board and connected via a plug 259.

A pipe 235 serves as a coupling member and projects to one end of a PC connector. The PC connector is formed so that it can rotate relative to the pipe 235. The pipe may be of any type as long as it is housed in either connector assembly, and rotatable and extensible. Likewise, the electroconductive member may have any shape as long as it is extensible and rotatable, and the pipe assembly 235 accommodating the electroconductive member may be composed of a single pipe. Thus, the electroconductive member and the pipe assembly are not limited to the shapes shown in the first and fourth embodiments.

Eighth Embodiment

Figure 21:
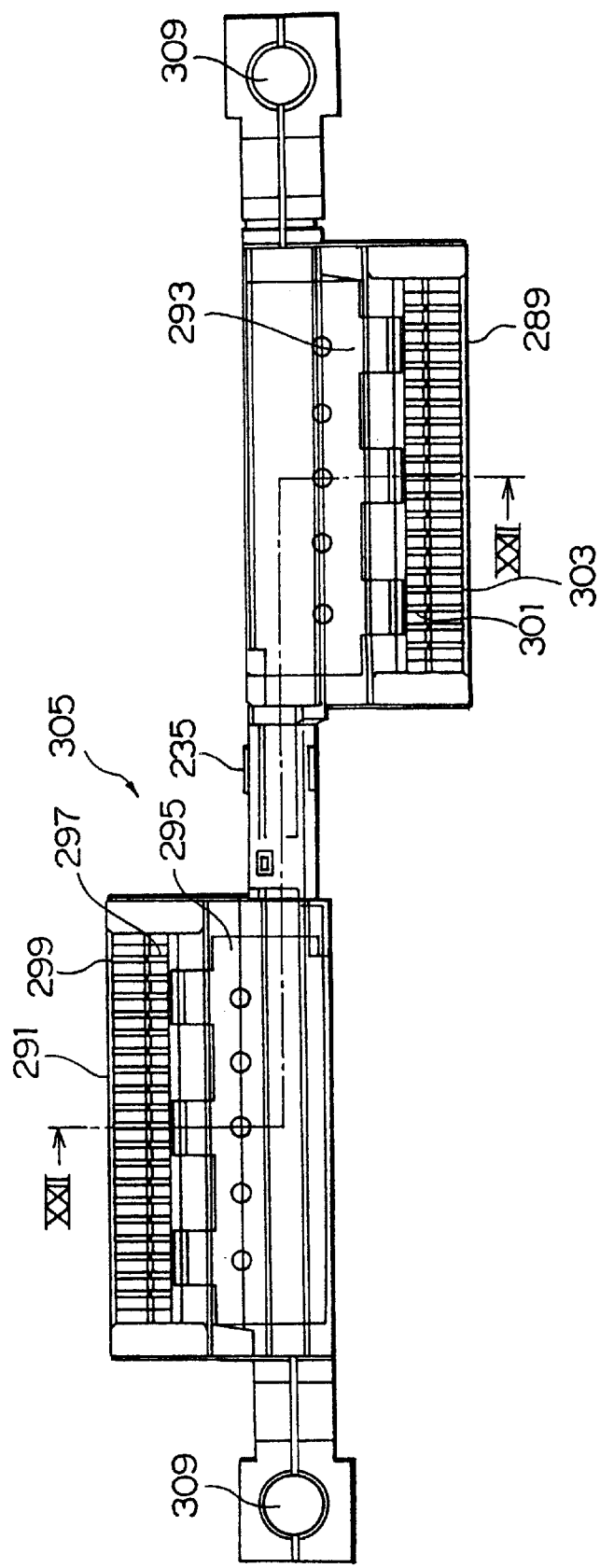
FIG. 21 is a perspective top plan view of the hinge connector according to an eighth embodiment of the present invention.
Figure 22:
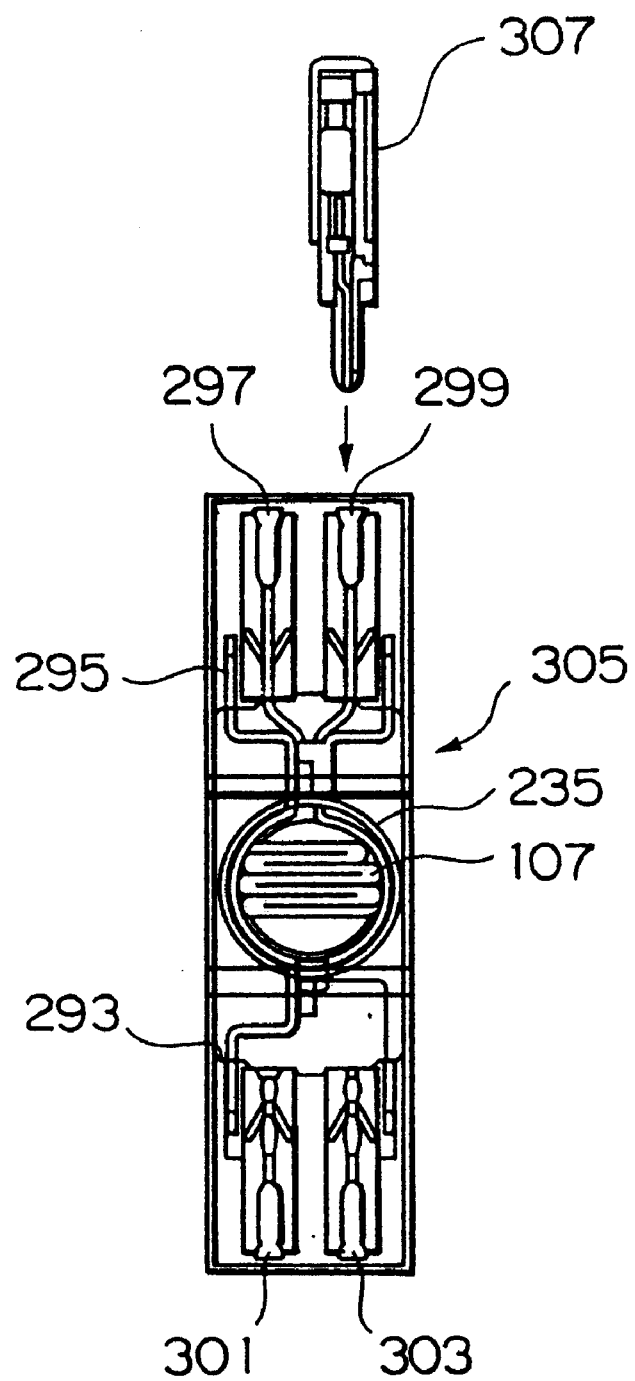
FIG. 22 is a sectional view taken along the line XXII—XXII of FIG. 21.

Referring to FIGS. 21 and 22, a PC connector assembly 289 and an LCD connector 291 both have two stages of pin terminal groups. FPC sockets will be provided and connected to the pin terminal groups. The PC connector assembly 289 and the LCD connector assembly 291 are connected via a pipe assembly 235 serving as a coupling member as in the case of the first through seven embodiments. The pipe assembly 235 is formed to be extensible lengthwise; however, it may be formed to be telescopic, or the pipe is not limited to these types if one of the connector assemblies is rotatable and extensible relative to the other connector assembly.

An electroconductive member of this embodiment has a folded form as in the case of the third embodiment, and is connected to the connector assemblies by being pressed into contact with contacts or the like via ground plates 293 and 295 as in the case of the third embodiment.

Groups of contacts 297 and 299 in which the FPCs are inserted are formed of two vertical rows for each FPC or plug so that two adjacent contacts for signals are sandwiched by contacts for grounding, one on each side. Furthermore, the ground contacts are connected to a shell to enhance grounding, contributing to improved EMI characteristics.

As an alternative, the ground contacts connected to the shell and the signal contacts may be formed widthwise freely or alternately according to an array of LVDS signals as in the case of the PC connector assemblies of the first through seventh embodiments.

The eighth embodiment provides the same operations and advantages as those of the seventh embodiment except that it is connectable to a hinge connector in addition to FPCs.

Thus, according to the present invention, an electroconductive member installed in and between first and second portions has a contractible, flexible portion, so that occurrence of damage to the electroconductive member can be prevented when assembling a hinge connector or installing the hinge connector to electronic equipment.

Furthermore, according to the present invention, the electroconductive member can be formed by winding or folding a sheet-like material, thus permitting the electroconductive member to be formed easily.

Moreover, the electroconductive member is folded and placed in a pipe, so that a hinge diameter can be reduced to permit a thinner LCD display to be achieved. Furthermore, improved durability and a prolonged service life of a hinge assembly can be also achieved.

In addition, according to the present invention, a hinge connector has connectors for first and second portions and first and second connectors for connection, and the first connector assembly and the second connector assembly are separable. With this arrangement, the first connector assembly and the first connector can be installed to the first portion, and the second connector assembly and the second connector can be installed to the second portion, then these two units can be combined. Hence, the first portion with the first connector assembly and the second portion with the second connector assembly can be manufactured separately, and combined into one unit in a last process of manufacture. The result is higher production efficiency of electronic equipment formed by combining the first portion and the second portion.

Furthermore, according to the present invention, the first connector assembly and the second connector assembly can be combined simply by coupling first and second pipes, and placing an electroconductive member between the pipes completes the assembly of a hinge connector, thus enabling easier assembly of the hinge connector.

In addition, according to the present invention, a hinge connector connectable to two rows of FPCs, pin connectors, or the like can be provided.

What is claimed is:

1. A hinge connector comprising:
   a coupling member in which an electroconductive member including a first flexible printed circuit is disposed and which is extensible in rotational and axial directions; and
   first connector and second connector elements connected via said coupling member such that they can rotate about an axis, respectively.

2. A hinge connector as claimed in claim 1, which is used for electrically connecting a first portion and a second portion that is rotatably combined to said first portion, said first and said second portions constituting an electronic equipment, said coupling member having a first coupling element and a second coupling element said hinge connector comprising:
   a first connector assembly formed by combining said first connector element with said first coupling element into one body;
   a second connector assembly formed by combining said first connector element with said second coupling element into one body and rotatably coupled to said first connector assembly; and
   said first FPC being an electroconductive member installed to said first connector assembly and said second connector assembly,
   said electroconductive member having a first connection which is provided at one end thereof and being connected to said first connector assembly and a second connection which is provided at the other end thereof and connected to said second connector assembly, and a flexible portion positioned between said first connection and said second connection, said flexible portion being contractible in a direction for connecting said first connection and said second connection.

3. A hinge connector as claimed in claim 1, wherein said electroconductive member is a cylindrical member formed by winding a sheet-like material into a cylindrical shape.

4. A hinge connector as claimed in claim 1, wherein said electroconductive member comprises a flexible portion and at least one slit formed in said flexible portion for ensuring flexibility in rotation and expansion in a lengthwise direction.

5. A hinge connector as claimed in claim 1, wherein said first connector assembly has a first connector for making electrical connection with said first portion, and said second connector assembly has a second connector for making electrical connection with said second portion, said first connection being connected to said first connector, while said second connection being connected to said second connector.

6. A hinge connector as claimed in claim 1, wherein said first connector assembly has a first pipe assembly, while said second connector assembly has a second pipe assembly to be coupled to said first pipe assembly, and said flexible portion of said electroconductive member is accommodated in said first and second pipe assemblies.

7. A hinge connector as claimed in claim 1,
wherein said connector assembly comprises a first contact portion to be connected to a mating connecting member that includes a second FPC, and a second contact portion to be connected to one end of said electroconductive member in said coupling member.

8. A hinge connector as claimed in claim 7, wherein said first FPC has at least two folded-back portions and is formed to be contractible.

9. A hinge connector as claimed in claim 7, wherein said connector assembly comprises a signal contact for transmitting an electrical signal, a ground contact to be connected to ground, an insulator for fixing and retaining said contacts, and a shell that covers said insulator, said ground contact compring a connection to be connected to said shell.

10. A hinge connector as claimed in claim 9, wherein said signal contacts are disposed in at least one of pairs and said ground contacts are disposed on each of both sides of said at least one of pairs.

11. A hinge connector as claimed in claim 7, wherein said connector assembly comprising a first connector assembly to be connected to one end of said electroconductive member and a second connector assembly to be connected to the other end of said electroconductive member, said first and second connector assemblies being formed so that they can rotate with respect to each other via said coupling member.

12. A hinge connector as claimed in claim 7, wherein said first contact portions are disposed in two rows that overlap one another.

13. A hinge connector as claimed in claim 7, wherein said electroconductive member comprises a flexible portion and at least one slit formed in said flexible portion, said electroconductive member being folded up at said at least one slit to ensure flexibility.

* * * * *